(12) United States Patent
Zhang et al.

(10) Patent No.: US 9,530,825 B2
(45) Date of Patent: Dec. 27, 2016

(54) DISPLAY PANEL (71) Applicants: Beijing BOE Display Technology Co., Ltd., Beijing (CN); BOE Technology Group Co., Ltd., Beijing (CN)

(72) Inventors: Chunbing Zhang, Beijing (CN); Liyan Xu, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 475 days.

(21) Appl. No.: 14/348,398

(22) PCT Filed: Nov. 15, 2013

(86) PCT No.: PCT/CN2013/087257
§ 371 (c)(1),
(2) Date: Mar. 28, 2014

(87) PCT Pub. No.: WO2014/205982
PCT Pub. Date: Dec. 31, 2014

(65) Prior Publication Data
US 2016/0260783 A1    Sep. 8, 2016

(30) Foreign Application Priority Data
Jun. 28, 2013   (CN) .......................... 2013 1 0267650

(51) Int. Cl.
G02F 1/1365    (2006.01)
H01L 27/32    (2006.01)
G02F 1/1333    (2006.01)
G02F 1/1368    (2006.01)
(Continued)

(52) U.S. Cl.
CPC ......... H01L 27/3227 (2013.01); G02F 1/1368 (2013.01); G02F 1/133362 (2013.01); G09G 3/02 (2013.01); G09G 3/20 (2013.01); H01L 27/3211 (2013.01); H01L 27/3262 (2013.01);
(Continued)

(58) Field of Classification Search
CPC ..................................................... G02F 1/1365
See application file for complete search history.

(56) References Cited

U.S. PATENT DOCUMENTS

5,570,990 A * 11/1996 Bonora ............... G03F 7/70541
269/17
2004/0183759 A1 * 9/2004 Stevenson ............... G02B 6/43
345/82
(Continued)

Primary Examiner — Timothy L Rude
(74) Attorney, Agent, or Firm — Frommer Lawrence & Haug LLP (57) ABSTRACT A display panel which can avoid RC delay is provided. The display panel comprises photosensitive transistors, data lines electrically connected with source electrodes of the photosensitive transistors, first electrodes electrically connected with drain electrodes of the photosensitive transistors, and light emitting diodes, wherein the photosensitive transistors are arranged in rows the direction of which is perpendicular to the extension direction of the data lines, and the light emitting diodes are arranged in rows, each row of light emitting diodes are arranged along the direction perpendicular to the extension direction of the data lines, and are used for simultaneously turning on all of the photosensitive transistors in a corresponding row.

18 Claims, 4 Drawing Sheets (51) Int. Cl.
*G09G 3/02* (2006.01)
*G09G 3/20* (2006.01)

(52) U.S. Cl.
CPC .............. *G09G 2300/0426* (2013.01); *G09G 2320/0223* (2013.01); *G09G 2360/148* (2013.01)

(56) References Cited

U.S. PATENT DOCUMENTS

| | | | |
|---|---|---|---|
| 2005/0116937 A1* | 6/2005 | Choi | G06F 3/042 345/173 |
| 2012/0044207 A1* | 2/2012 | Lan | G06F 3/0412 345/175 |
| 2012/0074474 A1* | 3/2012 | Kitagawa | H01L 27/14612 257/291 |
| 2013/0155024 A1* | 6/2013 | Chung | G06F 3/0412 345/175 |

* cited by examiner

DISPLAY PANEL

This application is a 371 of PCT/CN2013/087257 filed on Nov. 15, 2013, which claims priority benefits from the Chinese Patent Application No. 201310267650.8 filed Jun. 28, 2013, the disclosure of which is incorporated herein by reference.

TECHNICAL FIELD

The present invention relates to the field of display technology, and particularly, to a display panel.

BACKGROUND ART

Figure 1:
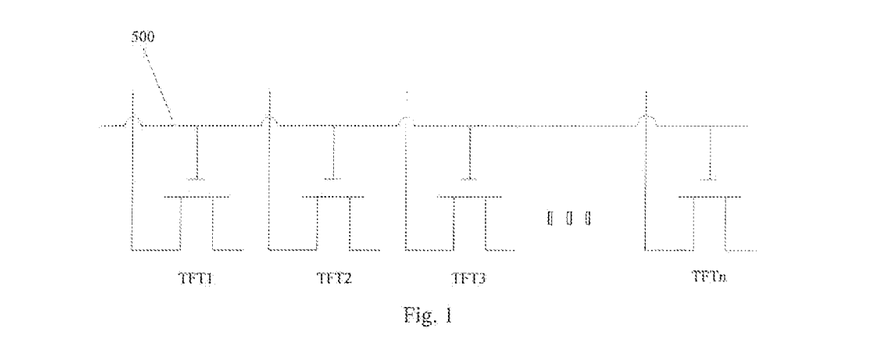
FIG. 1 is an equivalent schematic diagram of TFT drive according to prior art.

Currently, each active-matrix display device comprises thin film transistors (TFTs). As shown in FIG. 1, the TFTs are generally driven through scanning gate lines 500 row by row, so that all of the TFTs connected with a gate line 500 are simultaneously driven to be turned on or turned off by a control signal input on the gate line 500.

Figure 2:
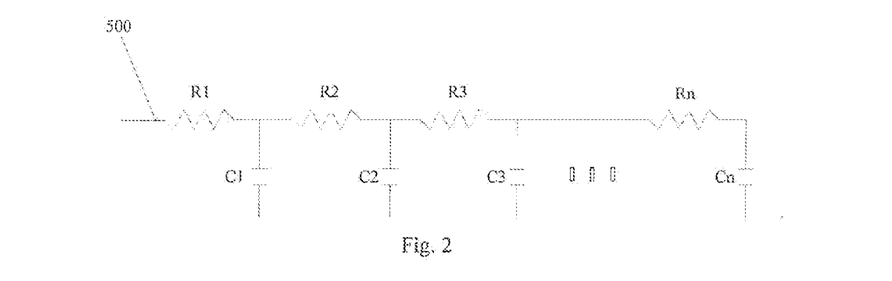
FIG. 2 is an equivalent schematic diagram of RC formed on gate lines according to prior art.

However, due to presence of parasitic capacitances of the TFTs themselves, capacitance between a pixel electrode and an adjacent gate line 500, and other capacitances of a liquid crystal display device (such as storage capacitance, liquid crystal capacitance, etc.), combined with sub-pixel equivalent resistance on the gate lines 500, a serial RC (R represents resistance, C represents capacitance) low-pass filter equivalent circuit as shown in FIG. 2 is formed on the gate line 500. According to the principle of a serial RC low-pass filter, the equivalent resistance Rn at a position far away from the signal input terminal of the gate line 500 is the sum of the previous equivalent resistances R1, R2, R3, . . . , Rn−1, and the equivalent capacitance Cn at a position far away from the signal input terminal of gate line 500 is the sum of the previous equivalent capacitances C1, C2, C3, . . . , Cn−1. Thus, the farther away the TFT from the signal input terminal of the gate line 500 is, the larger the RC delay of the signal received by the TFT is, resulting that the TFTs far away from the signal input terminal of the gate line are insufficiently charged or abnormally charged.

SUMMARY

The present invention provides a display panel which can avoid the RC delay.

In order to achieve the above objective, the present invention employs the following technical solutions.

In an aspect, a display panel is provided. The display panel comprises photosensitive transistors, data lines electrically connected with source electrodes of the photosensitive transistors, first electrodes electrically connected with drain electrodes of the photosensitive transistors, and light emitting diodes, wherein the photosensitive transistors are arranged in rows the direction of which is perpendicular to the extension direction of the data lines, and the light emitting diodes are arranged in rows, each row of light emitting diodes are arranged to extend along a direction perpendicular to the extension direction of the data lines, and are used for simultaneously turning on all of the photosensitive transistors in a corresponding row.

In the display panel of the present invention, since the photosensitive transistors in each row are turned on by the light emitted from the light emitting diodes in a corresponding row, it is not necessary to provide gate lines. Moreover, in the display panel of the present invention, the photosensitive transistors in different rows are independent of each other, and the on/off of the light emitting diodes will not be affected by capacitances, thereby there will be no RC delay. Further, in the structure of a traditional display panel, a gate drive IC is needed to be provided, thus the structure is more complex, and electrostatic breakdown phenomenon easily occurs. However, in the display panel of the present invention, since there is no need to provide gate lines, so that there is no need to provide a gate drive IC, thereby the occurrence of electrostatic breakdown can be reduced. Meanwhile, the aperture opening ratio can be improved since no gate line is provided.

BRIEF DESCRIPTION OF THE DRAWINGS

In order to more clearly illustrate the technical solutions in the present invention or prior art, the drawings used in the descriptions of the present invention or prior art will be briefly introduced as follows. Obviously, the drawings only illustrate some embodiments of the present invention, and ordinary skilled persons in the art may gain other drawings according to these drawings without paying creative works.

REFERENCE SIGNS

10—first base; 20—second base; 30—liquid crystal layer; 100—first substrate base;
200—second substrate base; 110—photosensitive transistor; 120—first electrode;
130, 130'—second electrode; 140—passivation layer; 150—organic light emitting layer;
160—data line; 210—light emitting diode; 220—first black matrix; 230—color filter layer;
240—second black matrix; 500—gate line; 1102—source electrode;
1103—drain electrode; 2101—third electrode; 2102—fourth electrode;

2103—light emitting layer; 2301—red pixel; 2302—green pixel; 2303—blue pixel.

DETAILED DESCRIPTION OF THE PREFERRED EMBODIMENTS

Technical solutions according to the embodiments of the present invention will be clearly and completely described below with reference to the drawings. Obviously, the described embodiments are merely the preferable embodiments rather than all of the embodiments of the present invention. All of other embodiments obtained by the ordinary skilled persons in the art based on the described embodiments fall into the protection scope of the present invention.

Figure 3:
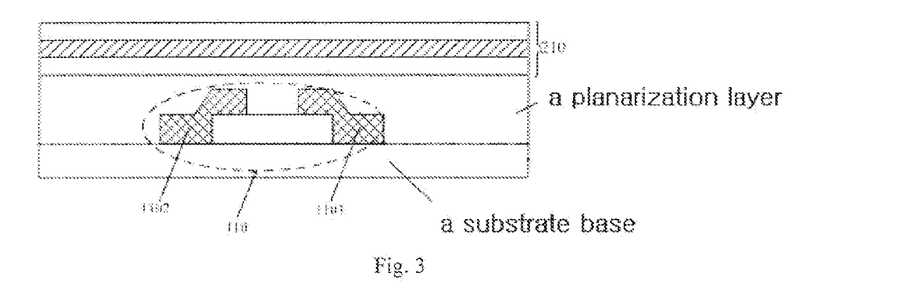
FIG. 3 is a schematic diagram of local structure of the display panel according to an embodiment of the present invention.

A display panel is provided in an embodiment of the present invention. As shown in FIG. 3, the display panel comprises photosensitive transistors 110, data lines (not shown in FIG. 3) electrically connected with source electrodes 1102 of the photosensitive transistors 110, first electrodes (not shown in FIG. 3) electrically connected with drain electrodes 1103 of the photosensitive transistors 110, and light emitting diodes 210, wherein the photosensitive transistors 110 are arranged in rows (only one photosensitive transistor in a row is shown in FIG. 3) the direction of which is perpendicular to the extension direction of the data lines, and each row of the light emitting diodes 210 are arranged along the direction perpendicular to the extension direction of the data lines, and are used for simultaneously turning on all of the photosensitive transistors in a corresponding row. The photosensitive transistors 110, the data lines electrically connected with the source electrodes of the photosensitive transistors, the first electrodes electrically connected with the drain electrodes of the photosensitive transistors, and the light emitting diodes 210 are provided on a same substrate base, and a planarization layer is provided between the photosensitive transistors 110 and the light emitting diodes 210, and the planarization layer is made of transparent insulation materials.

It should be noted that, although FIG. 3 only shows an example in which the photosensitive transistors are below the light emitting diodes, the photosensitive transistors may be above the light emitting diodes, which is not limited in the present invention.

Figure 4:
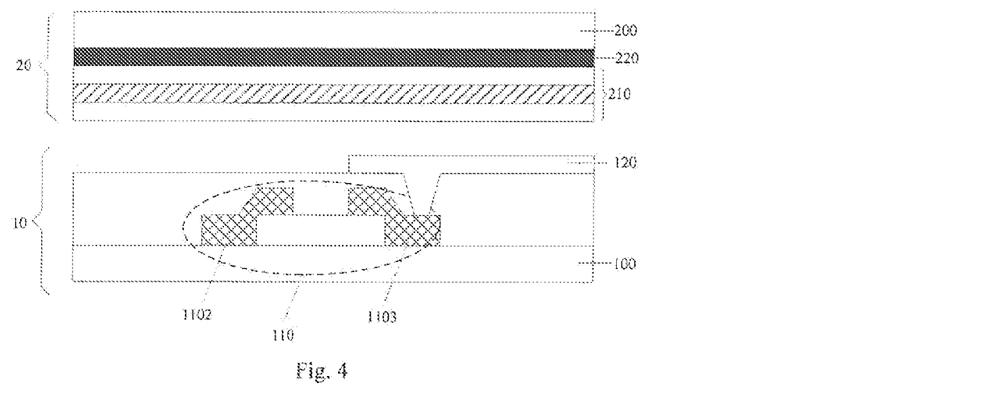
FIG. 4 is a schematic diagram of the structure of the display panel according to an embodiment of the present invention.

A display panel is provided in another embodiment of the present invention. As shown in FIG. 4, the display panel comprises a first base 10 and a second base 20.

The first base 10 comprises a first substrate base 100, photosensitive transistors 110 provided on the first substrate base, data lines (not shown in FIG. 4) electrically connected with the source electrodes 1102 of the photosensitive transistors, and first electrodes 120 electrically connected with the drain electrodes 1103 of the photosensitive transistors.

Here, the photosensitive transistors 110 may be only sensitive to invisible light, which can avoid the interference on the turning on or turning off of the photosensitive transistors 110 caused by, for example, the light emitted from back light source of the liquid crystal display device or the light emitted from the organic light emitting diode display device itself. Of course, if a light blocking component (such as a black matrix, etc.) is provided between the photosensitive transistors 110 and the display light source of the display panel so that the light for displaying and the light for controlling can be distinguished with respect to the light paths, the photosensitive transistors 110 sensitive to visible light may be employed.

The second base 20 comprises a second substrate base 200, light emitting diodes 210 provided on the second substrate base, and first black matrixes 220 provided between the second substrate base 200 and the light emitting diodes 210.

Wherein, the light emitting diodes 210 are arranged in rows, each row of light emitting diodes 210 are arranged along the direction perpendicular to the extension direction of the data lines and correspond to a row of photosensitive transistors 110, and are used for turning on all of the photosensitive transistors 110 in the corresponding row. The first black matrixes 220 are used for completely absorbing the light irradiating towards the photosensitive transistors 110 via the second substrate base 200 from external environment.

Here, for example, the area of the first black matrix 220 projected onto the second substrate base 200 may be provided to be larger than or equal to the area of the light emitting diode 210 projected onto the second substrate base 200, so as to avoid the interference on the turning on or turning off of the photosensitive transistors 110 caused by the light irradiating towards the photosensitive transistors 110 via the second substrate base 200 from external environment.

In addition, when the photosensitive transistors 110 are sensitive to invisible light, since the light emitting diodes 210 are used for turning on the photosensitive transistors 110, correspondingly, the light emitted from the light emitting diodes 210 is invisible light. Similarly, when the photosensitive transistors 110 are sensitive to visible light, correspondingly, the light emitted from the light emitting diodes 210 is visible light.

When the photosensitive transistors 110 are sensitive to visible light, the first black matrixes 220 are also used for absorbing the light irradiating towards the second substrate base 200 from the light emitting diodes 210, so that the normal display of the display panel is not affected by the visible light emitted from the light emitting diodes 210.

The display principle of the display panel described above is as follows: light is emitted from the light emitting diodes 210 provided on the second base 20, and is sensed by all of the photosensitive transistors 110 in the corresponding row on the first base 10, thus all of the photosensitive transistors 110 in the corresponding row are turned on. Therefore, the light emitting diodes 210 are controlled to successively emit light so that the photosensitive transistors 110 in the row corresponding thereto are successively turned on. When the photosensitive transistors 110 in a row are turned on, the first electrodes 120 in a row can be charged to desired voltages thereof via data lines by source electrode driving, so that the display points in the corresponding row display different gray scales. When the first electrodes 120 in a row are charged to desired voltages thereof, the light emitting diodes 210 in the corresponding row stop emitting light, then the light emitting diodes 210 in the next row start to emit light, and the first electrodes 120 in the next row are charged via data lines by source electrode driving, and so on.

It should be noted that, firstly, the photosensitive transistors are not limited by the embodiments of the present invention, and any structure of the photosensitive transistors in the prior art can be employed, as long as the photosensitive materials of the photosensitive transistors are sensitive to light of different wavelengths depending on the requirements. Preferably, the photosensitive transistors in a same row are the same with each other.

Secondly, structures of a display panel obtained by the skilled persons in the art without any creative work fall into the protection scope of the present invention. For example, when the display panel is a liquid crystal display panel, the display panel further comprises a liquid crystal layer provided between the first base 10 and the second base 20. When the display panel is an organic light emitting diode display panel, the display panel comprises an anode, a cathode and an organic light emitting layer provided between the anode and the cathode. When the display panel is a display panel of other types, the display panel comprises a display structure of corresponding types, and the repetitious details need not be given here.

When the display panel is a liquid crystal display panel, the first base 10 or the second base 20 further comprises second electrodes 130 (not shown in FIG. 4), wherein the first electrodes 120 are pixel electrodes, and the second electrodes 130 are common electrodes. When the display panel is an organic light emitting diode display panel, the first base 10 or the second base 20 further comprises second electrodes 130' (not shown in FIG. 4), wherein when the first electrodes 120 are anodes, the second electrodes 130' are cathodes, otherwise, when the first electrodes 120 are cathodes, the second electrodes 130' are anodes.

Thirdly, the materials of the first electrodes 120, the second electrodes 130 or 130' are determined depending on the type of the display panel, which is not limited in the embodiments of the present invention, as long as the display panel can be achieved.

Fourthly, FIG. 3 and FIG. 4 only show the pattern layers on the bases in a part of nontransparent region, that is, sectional view diagrams along the direction perpendicular to the data lines at the light emitting diodes 210 of the display panel are shown. In addition, all of the drawings are provided for clearly illustrating the related structures of the inventive concept embodied by the embodiments of the present invention, and some or all of the structures having nothing to do with the inventive concept are not shown in the drawings.

In the display panel according to the embodiments of the present invention, since all of the photosensitive transistors in each row on the first base are turned on by the emitted light of a light emitting diode in the corresponding row on the second base, it is unnecessary to provide gate lines on the first base. Moreover, in the display panel according to the embodiments of the present invention, the photosensitive transistors in respective rows are independent of each other, and the on/off of the light emitting diodes on the second base will not be affected by capacitances, thus there will be no RC delay. In addition, in the structure of a traditional display panel, a gate drive IC is also provided on the first base, since the first base itself is relatively complex, it is easy to occur electrostatic breakdown phenomenon on the first base. However, in the display panel according to the embodiments of the present invention, since it is unnecessary to provide gate lines, so that it is unnecessary to provide a gate drive IC, thereby the occurrence of electrostatic breakdown on the first base can be reduced, meanwhile, and the aperture opening ratio can be improved since no gate line is provided on the first base.

Considering limitation of manufacturing processes, when the photosensitive transistors 110 are sensitive to visible light, it is difficult to prevent the light for displaying from interfering the photosensitive transistors 110, thus the photosensitive transistors 110 are preferably sensitive to invisible light.

Preferably, the photosensitive transistors 110 are thin film photosensitive transistors, resulting that the display panel can be thinner to adapt to the market demand for thin display panels.

Preferably, the first black matrixes 220 are also used for avoiding the interference of the light emitted by the light emitting diodes 210 in a row on the photosensitive transistors 110 corresponding to the light emitting diodes 210 in an adjacent row.

Here, the first black matrix 220 can be made into a certain pattern (such as U-shape or other shapes), so that the light emitted from the light emitting diodes 210 travels along the vertical direction (i.e. the cell thickness direction of the display panel), thereby the light emitted from any light emitting diode 210 is only used for turning on all of the photosensitive transistors 110 in a corresponding row.

Further preferably, as shown in the sectional view diagram (FIG. 5) of the second base 20 along the direction of data lines, the first black matrix 220 can be made into a U-shape. In this case, the light emitting diodes 210 are provided in the recess of the U-shape and attached with the inner bottom of the recess, wherein the total height of the U-shape is larger than the sum of the height of the inner bottom of the recess and the height of the light emitting diode 210.

Figure 5:
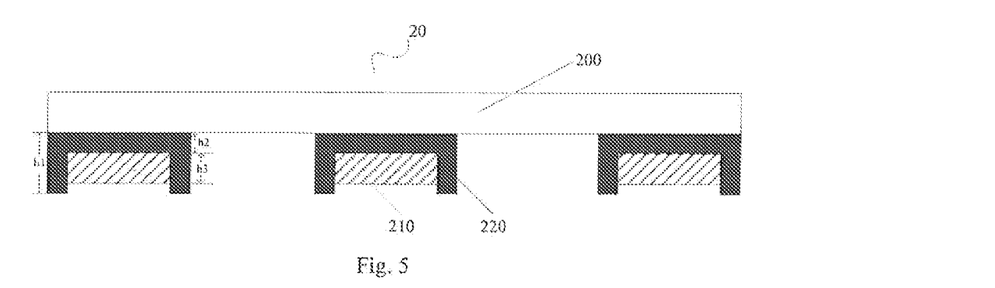
FIG. 5 is a sectional view diagram of the second base according to an embodiment of the present invention.

Here, each light emitting diode 210 is provided in the recess of the U-shape and attached with the inner bottom of the recess, that is, each light emitting diode 210 is completely attached to the inner bottom of the recess on the side close to the second substrate base 200. In addition, when the total height of the first black matrix 220 of U-shape is h1, the height of the inner bottom of the recess is h2, and the height of the light emitting diode 210 is h3, the total height of the U-shape is larger than the sum of the height of the inner bottom of the recess and the height of the light emitting diode 210, that is, h1>h2+h3.

Since the total height of the U-shape is larger than the sum of the height of the inner bottom of the recess and the height of the light emitting diode 210, the case wherein the photosensitive transistors 110 in a row are turned on by the light emitted from the light emitting diode 210 in the corresponding row while the photosensitive transistors 110 in other rows are also turned on can be avoided.

Figure 6:
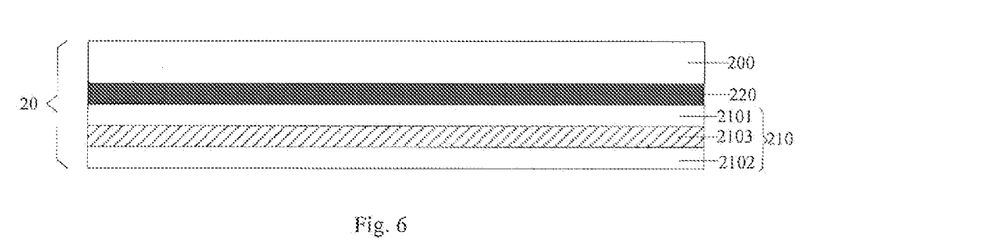
FIG. 6 is a sectional view diagram of the second base according to an embodiment of the present invention.

Optionally, as shown in FIG. 6, the light emitting diode 210 comprises a third electrode 2101, a fourth electrode 2102 and a light emitting layer 2103 provided between the third electrode and the fourth electrode. In this case, the second base 20 further comprises a plurality of signal lines (not shown in the drawing), which are electrically connected with the third electrodes 2101 of the light emitting diodes 210 respectively, and are used for successively charging the third electrodes 2101 respectively connected with each of them.

Wherein, the material of the light emitting layer 2103 can be selected depending on the wavelengths of the emitted light thereof, which is not limited here.

Thus, a drive IC similar to gate line drive can be provided to input signals into each signal line, so that the third electrodes 2101 respectively connected with each signal line are successively charged. As using traditional gate lines, the photosensitive transistors 110 in respective rows are turned on row by row by the light emitting diodes 210.

It should be noted that, the materials of the third electrodes 2101, the fourth electrodes 2102 and the light emitting layer 2103 are not limited, as long as the light emitting diodes 210 can emit light.

Further preferably, the materials of the light emitting layers 2103 of the light emitting diodes 210 in any adjacent rows may be different from each other so that the wavelengths of the invisible light emitted from them are different from each other. In this case, the photosensitive materials of the photosensitive transistors 110 in any adjacent rows perpendicular to the data lines are also different from each other, wherein the photosensitive materials of the photosensitive transistors 110 in each row are only sensitive to the light of wavelength emitted from the light emitting diode 210 in the corresponding row.

Thus, a case wherein the photosensitive transistors 110 in a row are turned on by the light emitted from the light emitting diodes 210 in the corresponding row while the photosensitive transistors 110 in other rows are also turned on can be further avoided.

Further preferably, along the direction of the data lines, the materials of the light emitting layers 2103 of the light emitting diodes 210 in odd numbered rows are the same with each other, and the materials of the light emitting layers 2103 of the light emitting diodes 210 in even numbered rows are the same with each other.

Correspondingly, the photosensitive materials of each row of photosensitive transistors 110 corresponding to the light emitting diodes 210 in odd numbered rows are the same with each other, and the photosensitive materials of each row of photosensitive transistors 110 corresponding to the light emitting diodes 210 in even numbered rows are the same with each other.

Since considering the aperture opening ratio in the manufacturing process thereof, the light emitting diodes 210 on the second base 20 will not be large, and the radiation range of the light emitted from them will not be wide, thus it is only needed to avoid that the photosensitive transistors in adjacent rows interfere with each other. As a result, in the whole procedure for forming the light emitting diodes 210 on the second base 20, only two patterning processes are needed to form the light emitting layers 2103 respectively with different materials in certain regions, thereby the number of the patterning processes is reduced and the cost can be reduced.

As an example, a plurality (here, ten for an example) of light emitting diodes 210 are provided on the second base 20, wherein the materials of the light emitting layers 2103 of the first, third, fifth, seventh, and ninth light emitting diodes are the same with each other, for example, GaAs (gallium arsenide) material can be employed, resulting that the emitted invisible light is infrared light. Then, the materials of the light emitting layers 2103 of the second, fourth, sixth, eighth, and tenth light emitting diodes are the same each other, for example, InGaN (Indium gallium nitrogen) material can be employed, resulting that the emitted invisible light is ultraviolet light. Other numbers of the light emitting diodes may be provided in similar manner, the details are not repeated here.

In this case, ten rows of the photosensitive transistors 110 are provided on the first base 10, and each row of photosensitive transistors 110 correspond to one light emitting diode 210, wherein the photosensitive materials of the photosensitive transistors 110 in the first, third, fifth, seventh, and ninth rows are the same with each other, for example, the material of N—Si which is only sensitive to infrared light can be employed. The photosensitive materials of the photosensitive transistors 110 in the second, fourth, sixth, eighth, and tenth rows are the same with each other, for example, the material of N—Si which is only sensitive to ultraviolet light can be employed. Other numbers of the rows of the photosensitive transistors may be provided in similar manner, the details are not repeated here.

In this case, when the first light emitting diode 210 on the second base 20 operates and emits infrared light, only the photosensitive transistors 110 in the first row on the first base 10 receive and sense the invisible infrared light so that all of the photosensitive transistors 110 in the first row are turned on, wherein the first row of the photosensitive transistors 110 corresponds to the first light emitting diode 210. When the second light emitting diode 210 on the second base 20 operates and emits invisible ultraviolet light, only the photosensitive transistors 110 in the second row on the first base 10 receive and sense the ultraviolet light so that all of the photosensitive transistors 110 in the second row are turned on, wherein the second row of the photosensitive transistors 110 corresponds to the second light emitting diode 210. The rest may be deduced by analogy.

Figure 7:
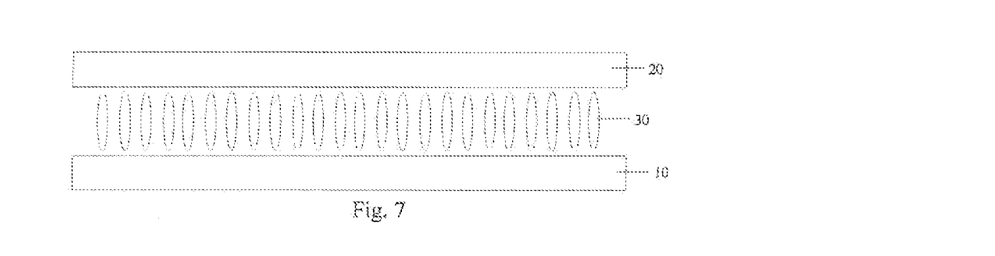
FIG. 7 is a schematic diagram of the structure of the liquid crystal display panel according to an embodiment of the present invention.

With respect to the display panel described above, as shown in FIG. 7, optionally, when the display panel is a liquid crystal display panel, the display panel further comprises a liquid crystal layer 30 provided between the first base 10 and the second base 20.

Further, the display panel according to the embodiments of the present invention may be a liquid crystal display panel in a Twisted Nematic (TN) mode, an Advanced Super Dimension Switch (ADS) mode, or an In Plane Switching (IPS) mode, etc., wherein the core technical features of the Advanced Super Dimension Switch technology are as follows: a multidimensional electric field is formed from an electric field generated by edges of slit electrodes in the same plane and an electric field generated between the slit electrode layer and the plate electrode layer, so that all alignment liquid crystal molecules between the slit electrodes, above the electrodes in the liquid crystal cell are able to rotate, thereby the work efficiency of the liquid crystal molecules is improved and the light transmittance is increased. The Advanced Super Dimension Switch technology can improve the image quality of the Thin Film Transistor-Liquid Crystal Display (TFT-LCD), and can result in advantages such as high resolution, high transmittance, low power consumption, wide view angle, high aperture opening ratio, low color difference, no push Mura, etc. OLED has a self-luminous property, and has advantages such as large view angle, notable power saving, etc.

Figure 8:
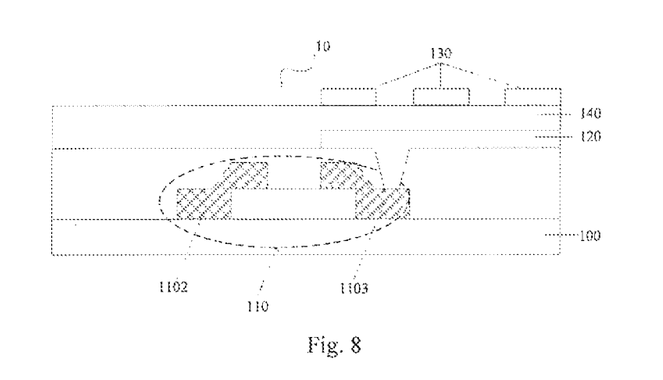
FIG. 8 is a sectional view diagram of the first base of the liquid crystal display panel according to an embodiment of the present invention.

For example, with respect to the display panel of the liquid crystal display device in an Advanced Super Dimension Switch mode, as shown in FIG. 8, the first base 10 further comprises second electrodes 130 and a passivation layer 140 between the first electrodes 120 and the second electrodes 130.

Figure 9:
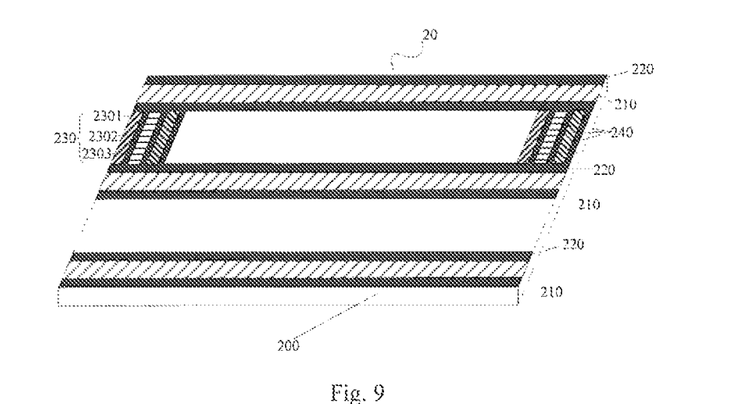
FIG. 9 is a top view diagram of the second base of the liquid crystal display panel according to an embodiment of the present invention.

In addition, as shown in FIG. 9, the second base 20 further comprises color filter layers 230 provided between any two adjacent light emitting diodes 210, wherein the color filter layer comprises red pixels 2301, green pixels 2302 and blue pixels 2303, and further comprises second black matrixes 240 provided between adjacent pixels among the red pixels 2301, green pixels 2302 and blue pixels 2303, wherein the second black matrixes 240 correspond to the data lines on the first base 10.

Optionally, when the display panel is an organic light emitting diode display panel, the first base 10 further comprises an organic light emitting layers 150 provided between the first electrodes 120 and the second electrodes 130', wherein the second electrodes 130' are provided on the first base 10.

In this case, the second electrodes 130' may be made of metals such as Mg, Ag, Al, etc., and the first electrodes 120 may be made of indium tin oxide (ITO).

Two embodiments are provided below to detail explain the structure of the display panel described above.

In a first embodiment, a liquid crystal display panel is provided. The display panel comprises a first base 10, a second base 20, a liquid crystal layer 30 provided the first base 10 and the second base 20, and a back light source provided on the side of the first base far away from the liquid crystal layer.

Figure 10:
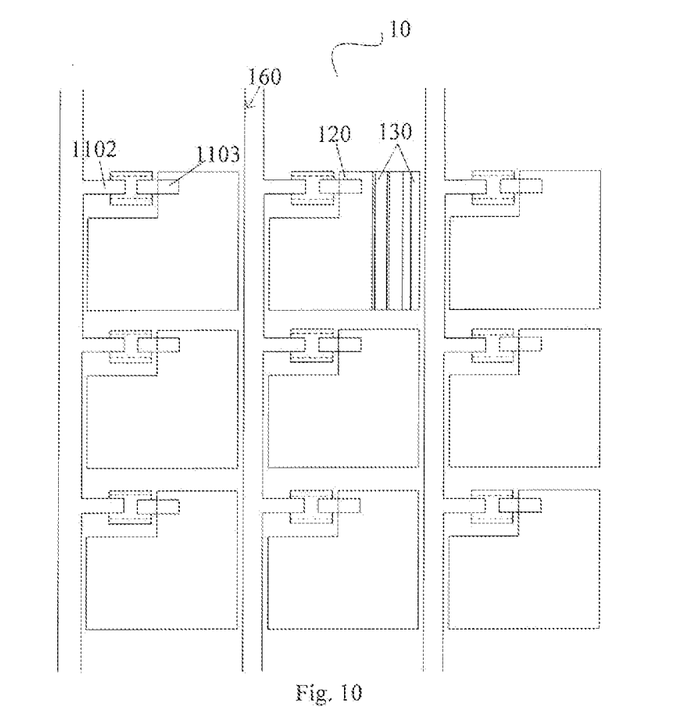
FIG. 10 is a top view diagram of the first base of the liquid crystal display panel according to a first embodiment of the present invention.

As shown in FIG. 10, the first base 10 comprises a first substrate base 100, and a plurality of photosensitive transistors 110 provided on the first substrate base 100, wherein the photosensitive transistors 110 are arranged in rows (with the direction perpendicular to data lines), and the photosensitive transistor 110 comprises: a source electrode 1102, a drain electrode 1103 and other pattern layers necessary to form the photosensitive transistor. All of the photosensitive transistors in odd numbered rows (for example, 1, 3, 5 . . . ) are sensitive to infrared light, and all of the photosensitive transistors in even numbered rows (for example, 2, 4, 6 . . . ) are sensitive to ultraviolet light. The first base 10 further comprises a plurality of data lines 160 electrically connected with the respective source electrodes 1102, first electrodes 120 electrically connected with the drain electrodes 1103, second electrodes 130, and a passivation layer 140 (not shown in FIG. 10) provided between the first electrodes 120 and the second electrodes 130. The extension direction of the data lines is perpendicular to the direction of the rows of the photosensitive transistors 110.

Referring to FIG. 9, the second base 20 comprises a second substrate base 200, a plurality of light emitting diodes 210 provided on the second substrate base, first black matrixes 220 provided between the second substrate base 200 and the light emitting diodes 210, and color filter layers 230 provided between any two adjacent light emitting diodes 210, wherein the color filter layer 230 comprises red pixels 2301, green pixels 2302 and blue pixels 2303, and further comprises second black matrixes 240 provided between adjacent pixels among the red pixels, green pixels and blue pixels, wherein the second black matrixes 240 correspond to the data lines on the first base 10.

Wherein, each light emitting diode 210 corresponds to a row of the photosensitive transistors 110, and each light emitting diode 210 comprises a third electrode 2101, a fourth electrode 2102 and a light emitting layer 2103 provided between the third electrode and the fourth electrode. The materials of the light emitting layers 2103 of the odd numbered light emitting diodes 210 are the material for emitting infrared light, and the materials of the light emitting layers 2103 of the even numbered light emitting diodes 210 are the material for emitting ultraviolet light. The second base 20 further comprises a plurality of signal lines (not shown) electrically connected with the third electrode 2101 of each light emitting diodes respectively.

Further, referring to FIG. 5, the first black matrixes 220 may be made into a U-shape, and the light emitting diodes 210 are provided in the recess of the U-shape and attached with the inner bottom of the recess, wherein the total height of the U-shape is larger than the sum of the height of the inner bottom of the recess and the height of the light emitting diodes 210.

In this case, since all of the photosensitive transistors 110 in each row on the first base 10 are turned on by the corresponding light emitting diode 210 on the second base 20, it is unnecessary to provide gate lines on the first base 10. Moreover, in the display panel according to the embodiments of the present invention, the photosensitive transistors 110 in respective rows are independent of each other, thus there will be no RC delay.

In a second embodiment, an organic light emitting diode display panel is provided. The display panel comprises a first base 10 and a second base 20.

Figure 11:
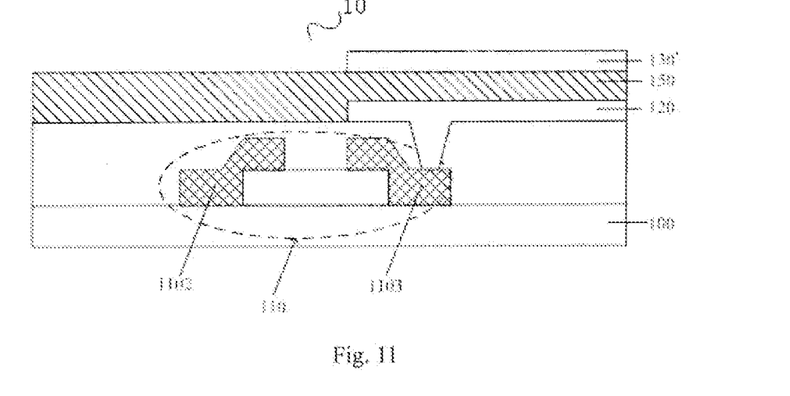
FIG. 11 is a sectional view diagram of the first base of the organic light emitting diode display panel according to a second embodiment of the present invention.

As shown in FIG. 11, the first base 10 comprises a first substrate base 100, and a plurality of photosensitive transistors 110 provided on the first substrate base 100, wherein the photosensitive transistors 110 are arranged in rows, and the photosensitive transistor 110 comprises a source electrode 1102, a drain electrode 1103, and pattern layers necessary to form the photosensitive transistor. All of the photosensitive transistors in odd numbered rows (for example 1, 3, 5 . . . ) are sensitive to infrared light, and all of the photosensitive transistors in even numbered rows (for example 2, 4, 6 . . . ) are sensitive to ultraviolet light. The first base 10 further comprises a plurality of data lines (not shown in FIG. 11) electrically connected with the source electrodes 1102 respectively, first electrodes 120 electrically connected with the drain electrodes 1103, second electrodes 130' and an organic light emitting layer 150 provided between the first electrodes 120 and the second electrodes 130'. The extension direction of the data lines is perpendicular to the direction of the rows of the photosensitive transistors 110. Of course, the first base 10 further comprises hole injection layer and hole transport layer provided between the first electrodes 120 and the organic light emitting layer 150, electron injection layer and electron transport layer provided between the second electrodes 130' and the organic light emitting layer 150.

The first electrodes 120 may be made of ITO, and the second electrodes 130' may be made of metals such as Mg, Ag, Al, etc.

Referring to FIG. 6, the second base 20 comprises a second substrate base 200, a plurality of light emitting diodes 210 provided on the second substrate base, and first black matrixes 220 provided between the second substrate base 200 and the light emitting diodes 210.

Wherein, each light emitting diode 210 corresponds to a row of the photosensitive transistors 110, and each light emitting diode 210 comprises a third electrode 2101, a fourth electrode 2102 and a light emitting layer 2103 provided between the third electrode and the fourth electrode. The materials of the light emitting layers 2103 of the odd numbered light emitting diodes 210 are the material for emitting infrared light, and the materials of the light emitting layers 2103 of the even numbered light emitting diodes 210 are the material for emitting ultraviolet light. The second base 20 further comprises a plurality of signal lines (not shown) electrically connected with the third electrode 2101 of each light emitting diodes respectively.

Further, referring to FIG. 5, the first black matrix 220 may be made into a U-shape, and the light emitting diodes 210 are provided in the recess of the U-shape and attached with the inner bottom of the recess, wherein the total height of the U-shape is larger than the sum of the height of the inner bottom of the recess and the height of the light emitting diode 210.

In this case, since all of the photosensitive transistors 110 in each row on the first base 10 are turned on by the corresponding light emitting diode 210 on the second base 20, it is unnecessary to provide gate lines on the first base 10. Moreover, in the display panel according to the embodiments of the present invention, the photosensitive transistors 110 in respective rows are independent of each other, thus there will be no RC delay.

A display method for the display panel described above is also provided in an embodiment of the present invention. The display method comprises a step of controlling the light emitting diodes 210 on the second base 20 of the display panel to emit light successively, so that all of the photosensitive transistors 110 in the row corresponding to the light emitting diode 210 being emitting light are turned on.

When all of the photosensitive transistors 110 in a row are turned on, the first electrodes 120 electrically connected with the respective drain electrodes 1103 of the photosensitive transistors in the row are charged by the drive signal supplied from the drive IC through the data lines electrically connected with the source electrodes 1102 of the photosensitive transistors in the row, so that the display structure corresponding to the first electrodes 120 and the second electrodes 130 or 130' provided on the first base 10 or the second base 20 displays, wherein the first electrodes 120 and the second electrodes 130 or 130' correspond one-to-one.

Here, a display structure is a display point. For a liquid crystal display panel, a display structure comprises a photosensitive transistor 110 on the first base 10, a first electrode 120 (i.e. pixel electrode) electrically connected with the drain electrode 1103 of the photosensitive transistor, a second electrode 130 (i.e. common electrode) corresponding to the first electrode, the corresponding red pixels 2301 or green pixels 2302 or blue pixels 2303 of the color filter layer 230 on the second base 20, and liquid crystal. For an organic light emitting diode display panel, a display structure comprises a photosensitive transistor 110 on the first base 10, a first electrode 120 (e.g. anode) electrically connected with the drain electrode 1103 of the photosensitive transistor, a second electrode 130' (e.g. cathode) corresponding to the first electrode, and an organic light emitting layer 150 between the first electrode 120 and the second electrode 130'.

In the display method for a display panel according to the embodiments of the present invention, since all of the photosensitive transistors in each row on the first base are turned on by the corresponding light emitting diode on the second base, it is unnecessary to provide gate lines on the first base. Moreover, in the display panel according to the embodiments of the present invention, the photosensitive transistors in respective rows are independent of each other, and the on/off of the light emitting diodes on the second base will not be affected by capacitances, thus there will be no RC delay. In addition, in the structure of a traditional display panel, a gate drive IC is also provided on the first base, since the structure of the first base is relatively complex, electrostatic breakdown phenomenon on the first base easily occurs. However, in the display panel according to the embodiments of the present invention, since it is unnecessary to provide gate lines on the first base, so that it is unnecessary to provide a gate drive IC, thereby the occurrence of electrostatic breakdown on the first base can be reduced, meanwhile, the aperture opening ratio can be improved since it is unnecessary to provide gate lines on the first base.

Further, the step of controlling the light emitting diodes 210 on the second base 20 to emit light successively comprises controlling the signal lines electrically connected with the respective third electrodes 2101 of the light emitting diodes 210 so that the light emitting diodes 210 emit light successively.

Although each light emitting diode corresponds to a row of the photosensitive transistors in the above embodiments of the present invention, a row of the light emitting diodes may correspond to one or more rows of the photosensitive transistors, wherein each row of the light emitting diodes may comprise a plurality of light emitting diodes. In this case, preferably, the third electrodes of the light emitting diodes in each row are integrated as a whole, and the fourth electrodes of the light emitting diodes in each row are integrated as a whole.

In addition, although the case wherein the source electrodes of the photosensitive transistors are connected with the data lines and the drain electrodes of the photosensitive transistors are connected with the pixel electrodes is shown in the embodiments of the present invention, the skilled persons in the art can understand that, due to the interchangeability between the source electrode and the drain electrode of a transistor in structure and composition, the drain electrodes of the photosensitive transistors may be connected with the data lines and the source electrodes of the photosensitive transistors may be connected with the pixel electrodes, which belongs to equivalent substitute of the above embodiments of the present invention.

It should be understood that, the above implementations are only used to explain the principle of the present invention, but not to limit the present invention, the person skilled in the art can make various variations and modifications without departing from the spirit and scope of the present invention, therefore, all equivalent technical solutions fall within the scope of the present invention, and the protection scope of the present invention should be defined by the claims.

The invention claimed is:

1. A display panel, comprising photosensitive transistors, data lines electrically connected with source electrodes of the photosensitive transistors, first electrodes electrically connected with drain electrodes of the photosensitive transistors, and light emitting diodes, wherein,
   the photosensitive transistors are arranged in rows the direction of which is perpendicular to the extension direction of the data lines, and
   the light emitting diodes are arranged in rows, each row of light emitting diodes are arranged along a direction perpendicular to the extension direction of the data lines, and are used for simultaneously turning on all of the photosensitive transistors in a corresponding row.

2. The display panel of claim 1, comprising a substrate base,
   wherein the photosensitive transistors, the data lines electrically connected with the source electrodes of the photosensitive transistors, the first electrodes electrically connected with the drain electrodes of the photosensitive transistors, and the light emitting diodes are provided on the substrate base, and
   wherein a planarization layer is provided between the photosensitive transistors and the light emitting diodes, and the planarization layer is made of transparent insulation materials.

3. The display panel of claim 1, comprising a first substrate base and a second substrate base, wherein
   a first base is formed by providing the photosensitive transistors, the data lines electrically connected with the source electrodes of the photosensitive transistors, and the first electrodes electrically connected with the drain electrodes of the photosensitive transistors on the first substrate base, a second base is formed by providing the light emitting diodes on the second substrate base.

4. The display panel of claim 3, further comprising first black matrixes provided between the second substrate base and the light emitting diodes, and the first black matrixes are used for completely absorbing the light irradiating towards the photosensitive transistors via the second substrate base from external environment.

5. The display panel of claim 4, wherein the area of the first black matrix projected onto the second substrate base is larger than or equal to the area of the light emitting diodes projected onto the second substrate base.

6. The display panel of claim 3, further comprising a liquid crystal layer provided between the first base and the second base.

7. The display panel of claim 6, wherein the first base or the second base further comprises second electrodes, wherein the first electrodes are pixel electrodes, and the second electrodes are common electrodes.

8. The display panel of claim 6, wherein the second base further comprises color filter layers provided between the light emitting diodes in any two adjacent rows, and the color filter layers comprise red pixels, green pixels, blue pixels, and second black matrixes provided between adjacent pixels among the red pixels, the green pixels and the blue pixels, wherein the second black matrixes correspond to the data lines of the first base.

9. The display panel of claim 3, wherein the first base or the second base further comprises second electrodes and an organic light emitting layer provided between the first electrodes and the second electrodes, wherein the second electrodes are anode or cathode electrodes.

10. The display panel of claim 4, wherein the first black matrix is also used for avoiding the interference of the light emitted by the light emitting diodes in each row on the photosensitive transistors corresponding to the light emitting diodes in the adjacent row.

11. The display panel of claim 4, wherein,
the first black matrix is of U-shape, and the light emitting diodes are provided in the recess of the U-shape and attached with the inner bottom of the recess, wherein the total height of the U-shape is larger than the sum of the height of the inner bottom of the recess and the height of the light emitting diodes.

12. The display panel of claim 1, wherein the photosensitive transistors are photosensitive transistors being sensitive for invisible light, and the light emitted from the light emitting diodes is invisible light.

13. The display panel of claim 1, wherein the photosensitive transistors are thin film photosensitive transistors.

14. The display panel of claim 1, wherein each of the light emitting diodes comprises a third electrode, a fourth electrode and a light emitting layer provided between the third electrode and the fourth electrode;
the display panel further comprises a plurality of signal lines, and each signal line is electrically connected with the third electrodes of the light emitting diodes in respective row and used for successively charging the third electrodes connected with the signal line.

15. The display panel of claim 14, wherein each row of the light emitting diodes includes only one light emitting diode.

16. The display panel of claim 14, wherein each row of the light emitting diodes includes a plurality of light emitting diodes, and
the third electrodes of each row of light emitting diodes are integrated as a whole, and the fourth electrodes of each row of light emitting diodes are integrated as a whole.

17. The display panel of claim 14, wherein the materials of the light emitting layers of the light emitting diodes in any adjacent rows are different from each other, and the photosensitive materials of the photosensitive transistors in any adjacent rows are different from each other.

18. The display panel of claim 17, wherein along the direction of the data lines, the materials of the light emitting layers of the light emitting diodes in odd numbered rows are the same with each other, the materials of the light emitting layers of the light emitting diodes in even numbered rows are the same with each other, the photosensitive materials of each row of photosensitive transistors corresponding to the light emitting diodes in odd numbered rows are the same with each other, and the photosensitive materials of each row of photosensitive transistors corresponding to the light emitting diodes in even numbered rows are the same with each other.

* * * * *